(12) United States Patent
Childs

(10) Patent No.: US 9,739,810 B2
(45) Date of Patent: Aug. 22, 2017

(54) DUTY CYCLE INDEPENDENT COMPARATOR

(71) Applicant: Dialog Semiconductor GmbH, Kirchheim/Teck-Nabern (DE)

(72) Inventor: Mark Childs, Swindon (GB)

(73) Assignee: Dialog Semiconductor (UK) Limited, Reading (GB)

( * ) Notice: Subject to any disclaimer, the term of this patent is extended or adjusted under 35 U.S.C. 154(b) by 56 days.

(21) Appl. No.: 14/262,995

(22) Filed: Apr. 28, 2014

(65) Prior Publication Data

US 2015/0301091 A1 Oct. 22, 2015

(30) Foreign Application Priority Data

Apr. 16, 2014 (EP) .................................. 14392004

(51) Int. Cl.
*H02M 3/156* (2006.01)
*G01R 19/165* (2006.01)
*H02M 1/00* (2006.01)

(52) U.S. Cl.
CPC . *G01R 19/16519* (2013.01); *G01R 19/16552* (2013.01); *H02M 3/156* (2013.01); *H02M 2001/0009* (2013.01)

(58) Field of Classification Search
CPC .... H02M 3/156; H02M 3/157; H02M 3/1588; H02M 2001/0012; H02M 2001/0009; H02M 1/4225; H02M 2001/0032; H02M 2001/008; H02M 3/155; H02M 3/158; H02M 2001/0019; H02M 3/33515; H02M 1/425; H02M 2001/4291; H02M 3/33561; H02M 3/1582; H02M 1/36
USPC ......................................................... 324/762
See application file for complete search history.

(56) References Cited

U.S. PATENT DOCUMENTS

| | | | |
|---|---|---|---|
| 5,689,162 A | 11/1997 | Li | |
| 6,479,975 B1 * | 11/2002 | Plankensteiner | |
| | | ........................ | G01R 19/16519 323/313 |
| 7,432,695 B2 | 10/2008 | Salerno | |
| 7,518,351 B2 | 4/2009 | Liao et al. | |
| 7,928,705 B2 | 4/2011 | Hooijschuur et al. | |
| 2002/0125869 A1 * | 9/2002 | Groom ................ | H02M 3/1584 323/283 |
| 2010/0289473 A1 * | 11/2010 | Ishii ...................... | H02M 3/156 323/284 |
| 2011/0101949 A1 * | 5/2011 | Lopata ................ | H02M 3/1588 323/286 |
| 2012/0293156 A1 * | 11/2012 | Galbis ................. | H02M 3/1588 323/350 |

* cited by examiner

*Primary Examiner* — Son Le
*Assistant Examiner* — Akm Zakaria
(74) *Attorney, Agent, or Firm* — Saile Ackerman LLC; Stephen B. Ackerman

(57) ABSTRACT

Disclosed are methods and circuits to measure independently of duty cycles a pulsed current of a pass transistor of a switched circuit. Methods and circuits of one embodiment may be applied to precisely operate DC-to-DC converters such as buck converters in the most efficient operation modes. Another embodiment can be used to measure the pulsed current independently of duty cycle over a wide range of current values.

26 Claims, 5 Drawing Sheets

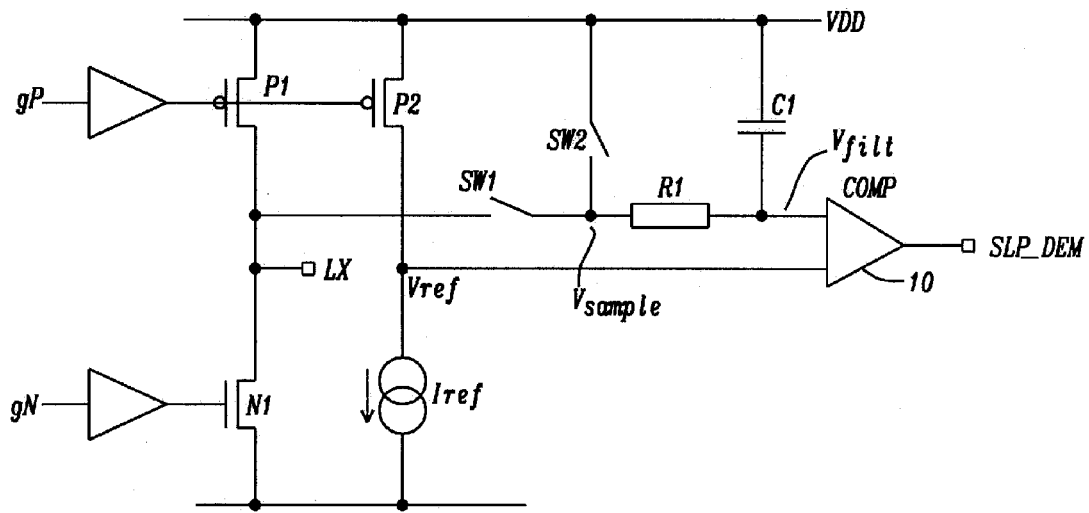
*FIG. 1 — Prior Art*
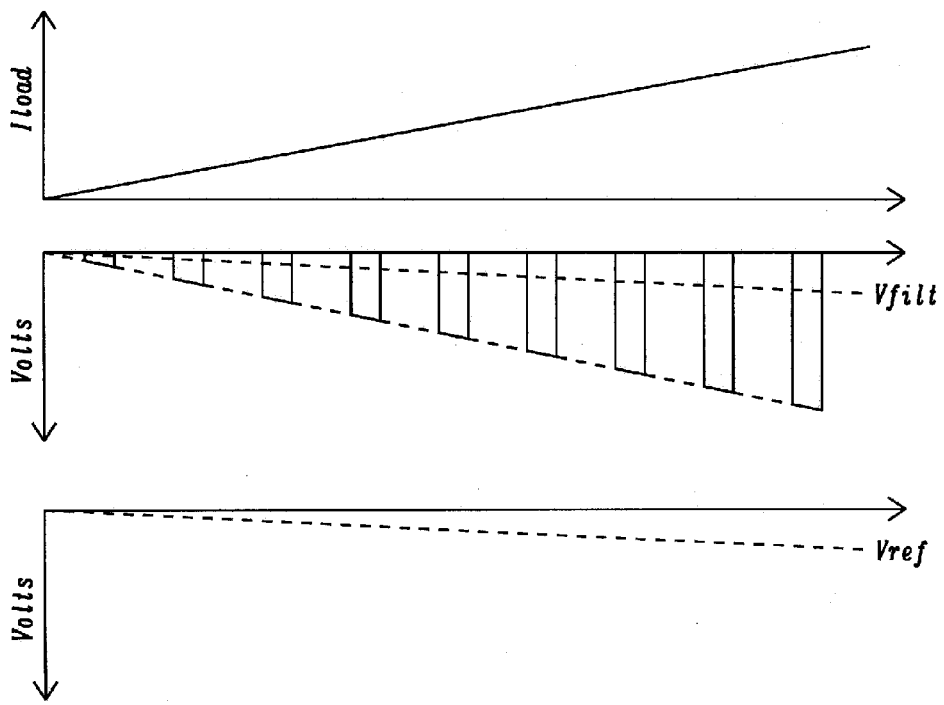
*FIG. 2 — Prior Art*

DUTY CYCLE INDEPENDENT COMPARATOR

TECHNICAL FIELD

The present document relates to switching DC-to-DC converters. In particular, the present document relates to electronic circuits and methods to distinguish correctly between a low quiescent operation mode and a high output current operation mode.

BACKGROUND

In switching DC-to-DC converters, such as e.g. buck converters, an auto-sleep function decides whether the switching converter should be operating in a low output current/low quiescent mode (in buck converters known to the inventors this is referred to as PFM mode) or a high output current/high quiescent mode (PWM mode).

The low current mode is very efficient but cannot handle high load currents. The high current mode gives good load transient performance, but with high quiescent currents.

The buck converter therefore automatically switches between modes. This is performed by measuring output current and deciding which mode would give higher efficiency.

The buck converter measures in prior art the output current by measuring the voltage drop across the PMOS pass-device. This voltage drop is very small, but is proportional to the current in the PMOS pass device while it is on. Of course, the PMOS pass device is not switched on all the time, and for some parts of a cycle it will be switched off. At this point the switching node goes low and, if the voltage across the PMOS pass device is still measured, it would correspond to a very large, and false, output current.

Measuring another voltage than the voltage drop of the PMOS pass device is not practical in most buck converter or other converter architectures.

SUMMARY

A further principal object of the disclosure is to distinguish correctly and fast between low quiescent operation mode and a high output current operation mode of switching circuits independently of duty cycle variations . . . .

A further principal object of the disclosure is to distinguish correctly and fast between low quiescent operation mode and a high output current operation mode of switching circuits independently of duty cycle variations covering also sleep mode operation . . . .

A further object of the disclosure is to achieve a method and a circuit thereof which measures a pulsed current for only part of a cycle, and assumes a value for the remaining part of the cycle.

A further object of the disclosure is to achieve a circuit that compares the average of the measured voltage to a reference voltage and samples then the same reference voltage as is used for the comparison for the remaining part of the cycle.

In accordance with the objects of this disclosure a circuit configured to measure a pulsed current through a pass transistor of a switching circuit in order to detect, independently of a duty cycle of the switching circuit, if the current through the pass transistor has reached one or more threshold values has been achieved. The circuit disclosed comprises a pass transistor connected between a supply voltage and a load of the pass transistor, a node for a reference voltage, and a circuit capable of comparing the reference voltage with a voltage representing the pulsed current through the pass transistor while the pass transistor is ON, including suitably filling-in a voltage to a remaining part of a cycle of the switching circuit while the pass transistor is OFF, wherein the comparison detects independently of the duty cycle if the current through the pass transistor has reached one or more threshold values.

In accordance with the objects of this disclosure a circuit configured to measure a pulsed current through a pass transistor of a switching circuit in order to detect, independently of a duty cycle of the switching circuit, if the current through the pass transistor has reached one or more threshold values has been achieved. The circuit disclosed firstly comprises: a pass transistor connected between a supply voltage and a load of the pass transistor, a sense transistor connected between the supply voltage and a current source, wherein a node for a reference voltage is deployed between the sense transistor and the current source and wherein the node for the reference voltage is connected to a second terminal of a second switch and to a second input of a comparator, wherein the sense transistor is matched to the pass transistor, and said current source connected between ground and said sense transistor. Furthermore the circuit comprises a first switch wherein a first terminal of the switch is connected to the load of the pass transistor and a second terminal of the switch is connected to a first input of the comparator and to a first terminal of the second switch, said second switch; and said comparator wherein its output is used to detect if the current through the pass transistor has reached a threshold; wherein the first switch is closed and the second switch is open during ON-time of the pass transistor and vice versa the first switch is open and the second switch is closed during OFF-time of the comparator.

In accordance with the objects of this disclosure a method to measure a pulsed current through a pass transistor of a switching circuit in order to detect, independently of a duty cycle of the switching circuit, if the current through the pass transistor has reached a threshold value has been achieved. The method disclosed comprises the steps of: (1) providing a switching circuit comprising a pass transistor, a reference voltage and an arrangement of two switches, and (2) comparing the reference voltage with a voltage representing the pulsed current through the pass transistor while the pass transistor is ON, plus a voltage suitably filling-in a remaining part of a cycle of the switching circuit while the pass transistor is OFF, wherein the comparison detects independently of the duty cycle if the current through the pass transistor has reached one or more threshold values.

In accordance with the objects of this disclosure a method to measure a pulsed current through a pass transistor of a switching circuit independently of a duty cycle of the switching circuit has been achieved. The method disclosed comprises the steps of (1) providing a switching circuit comprising a pass transistor and an arrangement of switches, and (2) measuring the current through the pass transistor during an ON-time of the pass transistor wherein during OFF-time of the pass transistor an average current measurement of the previous period is filled-in.

BRIEF DESCRIPTION OF THE FIGURES

The invention is explained below in an exemplary manner with reference to the accompanying drawings, wherein FIG. 1 prior art shows an auto-sleep detect circuit.

FIG. 2 prior art illustrates auto-sleep detect operation.

DETAILED DESCRIPTION

Figure 3A:
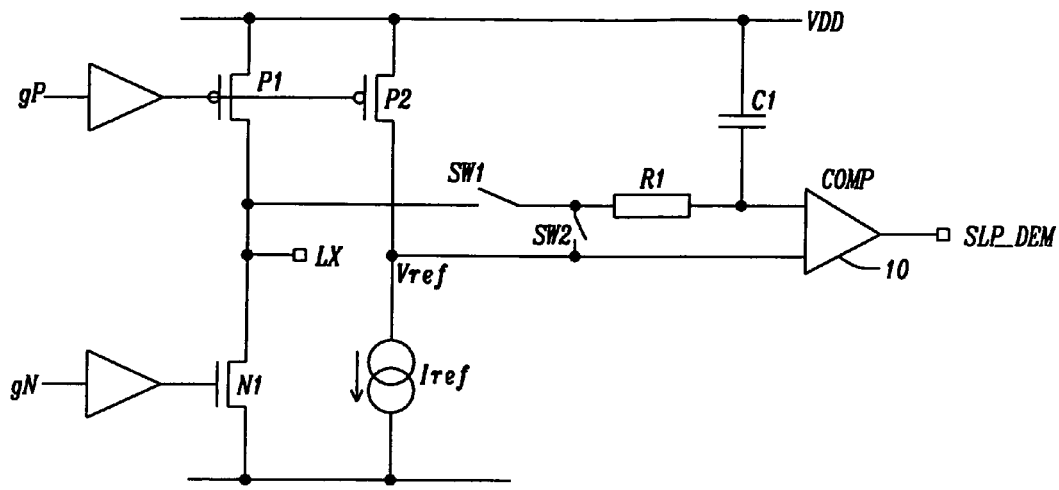
FIG. 3a shows a PMOS pass transistor being connected in a configuration having a common gate and source potential with a "dummy output device" P2, wherein a current source Iref generates a current through P2.

Methods and circuits to control a switching DC-to-DC-converter is in sleep operation mode, i.e. pulse-frequency modulation (PFM) mode or in high-output current operation mode, i.e. pulse width modulation (PWM) mode to ensure that the converter operates in a mode with the highest efficiency according to an actual load situation.

It should be understood that the disclosure can be applied to any circuit providing a continuous triangle wave signal wherein only half of the triangle wave can be monitored. An average value of the half wave, which can't be monitored, must be the same average value as the average value of the half wave signal which is monitored.

In a preferred embodiment of the invention a buck DC-to-DC converter is described. It should be noted that the methods and circuits disclosed can be applied to any switched mode converters to ensure maximum efficiency in spite of a wide range of duty cycles.

An auto-sleep function averages an output current of a switching converter over several cycles to determine what the average output current is. If this is high, then the buck moves to sync mode (PWM) if it is low, then it moves to sleep mode (PFM).

FIG. 1 prior art shows an auto sleep detect circuit. The pass-devices are formed by the transistors P1 and N1. The switching voltage LX is output to an inductor and a capacitor (not shown) to smooth the voltage. The LX voltage is also sensed by the switch SW1 which is closed when the PMOS P1 is on. The main pass-device P1 has a sense device P2 which is well matched to P1. This device P2 is biased with the reference current Iref to generate a voltage Vref with respect to supply voltage VDD. The sampled sense voltage is filtered by resistor R1 and capacitor C1 and compared to the reference voltage Vref by the comparator 12.

Generally, if the average voltage on node LX, when the PMOS P1 is on, is lower than Vref then it is an indication that the output current is high and the buck should be operating in PWM mode.

However, when the PMOS P1 is off, the LX node goes low to almost the ground voltage. This must not be included in the averaged voltage signal, as it would equate to a very large current through the PMOS P1 transistor. The sampling circuit of FIG. 1 prior art samples instead the supply voltage VDD, which is logically equal to the no-current voltage. This is done by opening switch SW1 and closing switch SW2.

The operation of the circuit of FIG. 1 prior art is shown in FIG. 2 prior art. The reference voltage Vref is created by passing the reference current $I_{REF}$ through the dummy output device P2. FIG. 2 prior art shows in the top diagram a load current $I_{load}$ of the buck converter, in the middle diagram Vsample and Vfilt, which has been smoothed by the RC filter R1/C1. And in the bottom diagram a constant reference voltage Vref is shown. The dotted line Vfilt again, the comparator 10 switches when Vref equals Vfilt.

In order to calculate the correct current for the reference current $I_{REF}$ the following analysis can be performed:

$$V_{LX}=V_{DD}-R_{on}\times I_{on} \text{ and } V\text{ref}=V_{DD}-R_{ref}\times I_{ref},$$

and, if D is the duty cycle and T is the period:

$$T\times V_{average}=T_{on}\times V_{LX}+T_{off}\times V_{DD} \text{ where}$$

$$T_{on}=D\times T \text{ and } T_{off}=(1-D)\times T \text{ so}$$

$$V_{average}=D\times V_{LX}+(1-D)\times V_{DD}, \text{ which reduces to}$$

$$V_{average}=V_{DD}D\times R_{on}\times I_{on}$$

Now the comparator 10 will switch when $$V_{average}=V\text{ref which reduces to}$$

$$I_{ref} = D\times I_{on} \times \frac{Ron}{Rref}$$

It should be obvious now that the circuit is dependent upon duty cycle and so the threshold can't accurately be calculated in the presence of duty cycle D variations.

For e.g. buck converters with a large range of output and input volt the duty cycle can vary by a large amount. This, in turn, causes a very large variation in auto-sleep threshold currents.

FIG. 3 illustrates one embodiment of an auto-sleep detect circuit of the present disclosure. The auto-sleep detect block of FIG. 3 controls whether the buck converter is in PFM or PWM mode. The block primarily measures the average current in the output to determine whether sleep or sync mode would be more efficient. The block also monitors the buck in sleep to detect fast load transients that would require sync mode to follow.

The average current is monitored by measuring the current in the PMOS, sampling this value and then filtering the result by the RC-Filter comprising resistor R1 and capacitor C1.

In order to make the circuit non duty-cycle dependent the sample circuit of FIG. 3 must switch between node LX and the reference voltage $V_{ref}$ itself, i.e. during the ON-phase of PMOS transistor P1 switch SW1 is closed and switch SW2 is open, while during the OFF-period of transistor P1 switch SW1 is open and switch SW2 is closed The analysis of the circuit is as follows:

$$V_{LX}=V_{DD}-R_{on}\times I_{on} \text{ and } V_{ref}=V_{DD}-R_{ref}\times I_{ref} \text{ and}$$

$$T\times V_{average}=T_{on}\times V_{LX}+T\text{off}\times V_{ref} \text{ where } T_{on}=D\times T \text{ and } T_{off}=(1-D)\times T \text{ so}$$

$$V_{average}=D\times V_{LX}(1-D)\times V\text{ref which reduces}$$

$$V_{average}=V_{DD}-D\times R_{on}\times I_{on}-R_{ref}\times I_{ref}+D\times R_{ref}\times I_{ref}$$

Now the comparator will switch when $$V_{average} = V_{ref}$$ which reduces to $$I_{ref} = I_{on} \times \frac{Ron}{Rref},$$

wherein resistance Rref corresponds to the ON-resistance of transistor P2 shown in FIG. 3.

The reference current $I_{ref}$ has no duty-cycle (D) term, confirming $I_{ref}$ is fixed and not duty cycle dependent. Thus the circuit of FIG. 3 measures exactly the current through the PMOS transistor at any time and circumstances. This is graphically demonstrated in FIG. 4 illustrating how the auto-sleep detect circuit of FIG. 3 operates. FIG. 4 shows clearly that when the load current is low the sampling effect makes the average signal too high. When the load current is high the sampling effect makes the average signal too low. But, when the PMOS current is at the threshold value, the sampling effect has no effect on the signal value.

Figure 4:
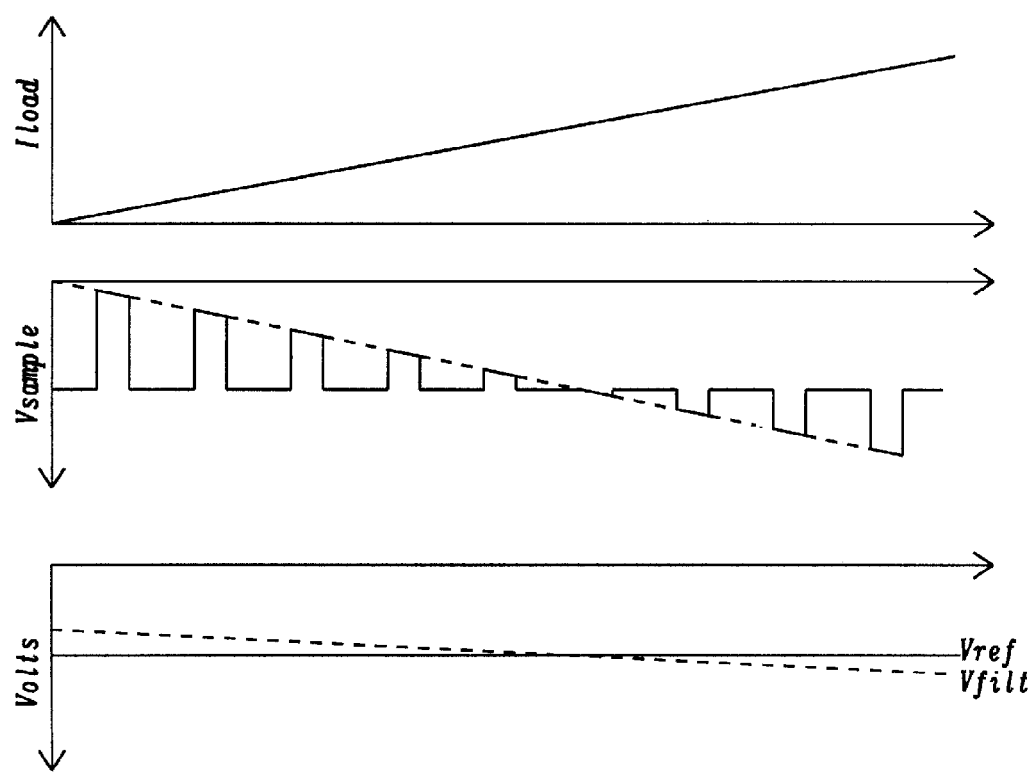
FIG. 4 shows how the auto sleep detect circuit of FIG. 3 operates.

FIG. 3a shows a PMOS pass transistor being connected in a configuration having a common gate and source potential with a "dummy output device" P2, wherein a current source Iref generates a current through P2.

Figure 3B:
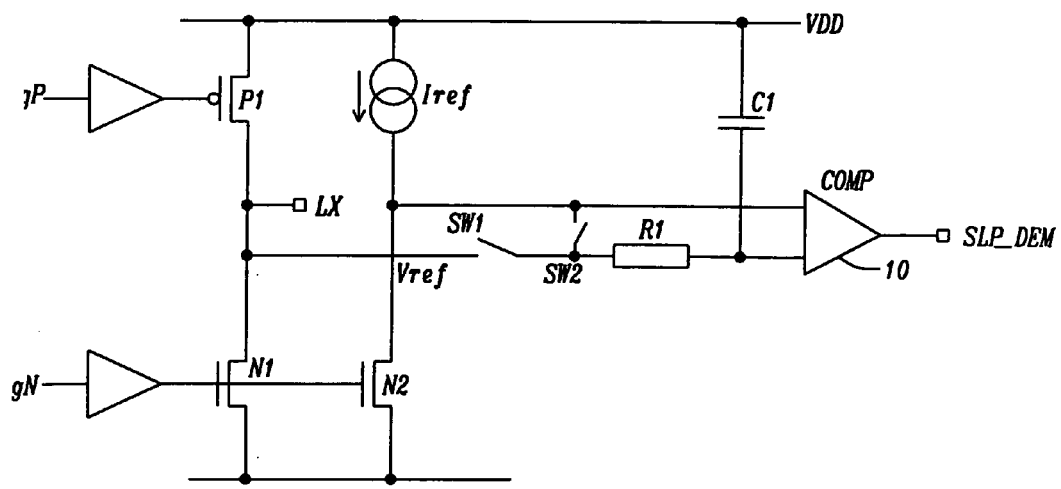
FIG. 3b shows that alternatively an NMOS pass device is connected to a dummy NMOS device wherein a current source generates a current through the dummy NMOS device.

FIG. 3b shows that alternatively an NMOS pass device could be used that is connected to a dummy NMOS device wherein a current source generates a current through the dummy NMOS device.

It should be noted that Vfilt, as shown in FIG. 4 corresponds to Vaverage after filtering by the RC filter comprising R1 and C1. Additionally a hysteretic function is provided to prevent any toggling between operation modes.

Figure 5:
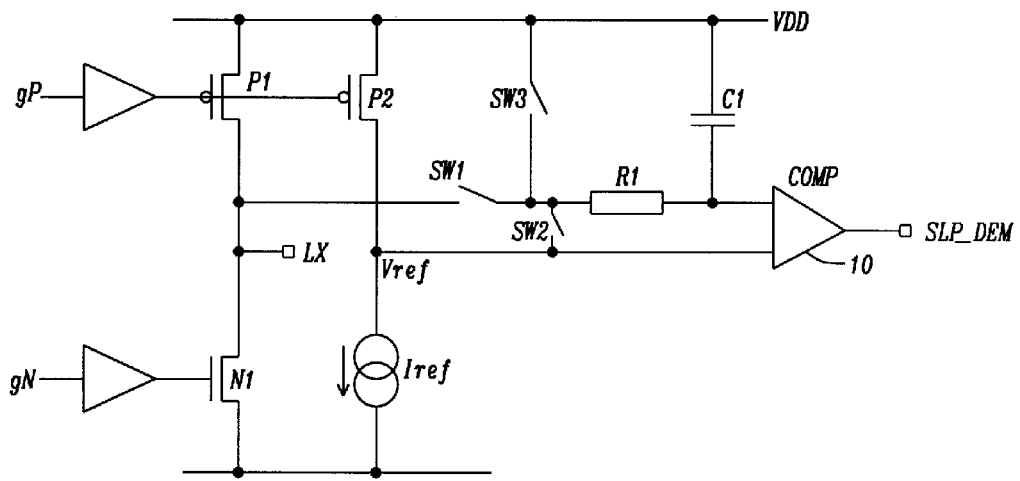
FIG. 5 shows an auto-sleep detect circuit of the present disclosure supporting sleep operation.

A key extension of the circuit is to cover sleep mode operation. FIG. 5 shows an auto-sleep detect circuit of the present disclosure supporting sleep operation. In sleep mode the output is tri-stated if the current in the coil reaches zero. This can provide a very high efficiency mode for low loads, a third switch SW3 is needed in this case. The third switch SW3 connects the sample point to the supply voltage whenever the output is tri-state. Switch SW1 is ON when PMOS transistor P1 is ON, switch SW3 is ON when neither PMOS transistor P1 nor NMOS transistor N1 are ON, and switch SW2 is ON when NMOS transistor N1 is ON.

Alternately, in sleep mode, when NMOS transistor N1 is ON, all three switches SW1, SW2, and SW3 are open achieving a tri-state mode.

Figure 6:
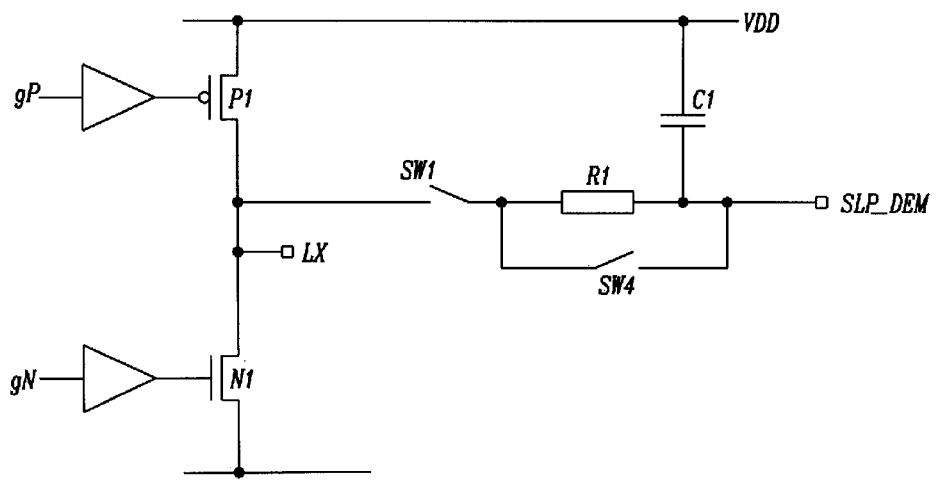
FIG. 6 depicts a circuit disclosed for analog measurement of switching signals.

A related variation of the circuit supporting sleep operation of the present disclosure is illustrated in FIG. 6. FIG. 6 depicts a circuit disclosed for analog measurement of switching signals allowing the average current signal to be measured directly. In this case the value of the average current is not being measured against a reference, so the "fill-in" voltage is not known. Instead it is proposed to "fill-in" the unknown portion of the signal by using the average of the preceding period. This can be done by feeding back the average current signal back to the sample point during the off-time via switch SW4 of FIG. 6 during off-time In this case the circuit essentially works similar as a sample and hold, except that the value to be held is first filtered. This means that the circuit does not simply sample the last value before the switch SW1 turns off (which would give peak sampling and add back duty-cycle dependence) but instead holds the average value of the signal during the on-times of the preceding cycles. Again, the value during the off-time is not added, and so does not distort the averaged signal.

The output signal at the port SLP-DEM thus represents a true measurement of the coil current and allows a correct control of PFM, PWM and sleep modes independently of the duty cycle in any range of the current. The output signal can also be used for any other further processing because it presents a true measurement of the pulsed current through the pass transistor.

Figure 7:
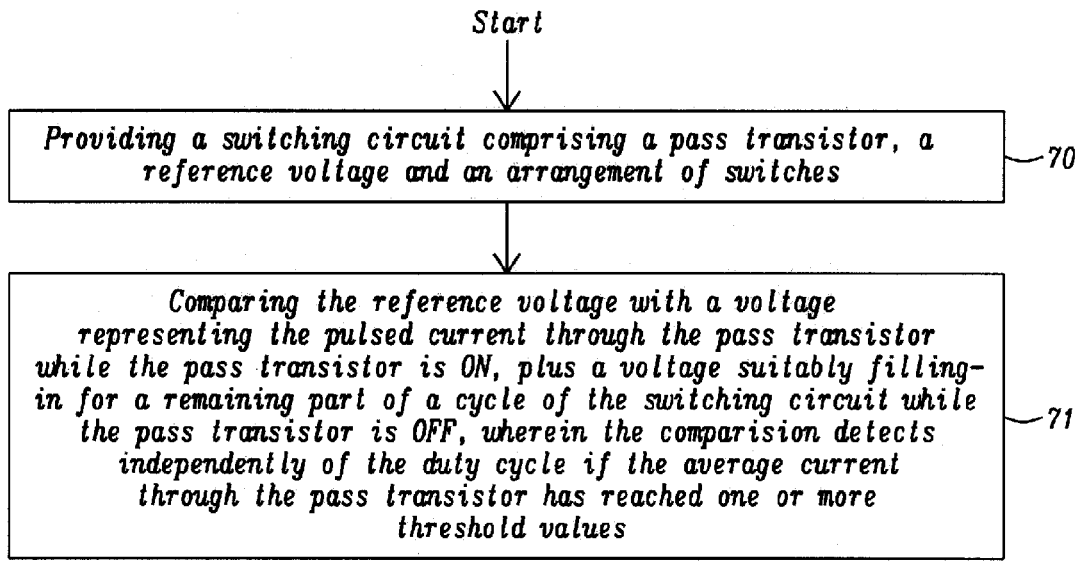
FIG. 7 shows a flowchart of a method to measure a pulsed output current of a pass transistor of a switching circuit in order to detect, independently of a duty cycle.

FIG. 7 shows a method to measure a pulsed output current of a pass transistor of a switching circuit in order to detect, independently of a duty cycle of the switching circuit, if the current through the pass transistor has reached one or more threshold values.

A first step 70 depicts a provision of a switching circuit comprising a pass transistor, a reference voltage and an arrangement of switches. The next step 71 shows comparing the reference voltage with a voltage representing the pulsed current through the pass transistor while the pass transistor is ON, plus a voltage suitably filling-in a remaining part of a cycle of the switching circuit while the pass transistor is OFF, wherein the comparison detects independently of the duty cycle if the current through the pass transistor has reached one or more threshold values.

Figure 8:
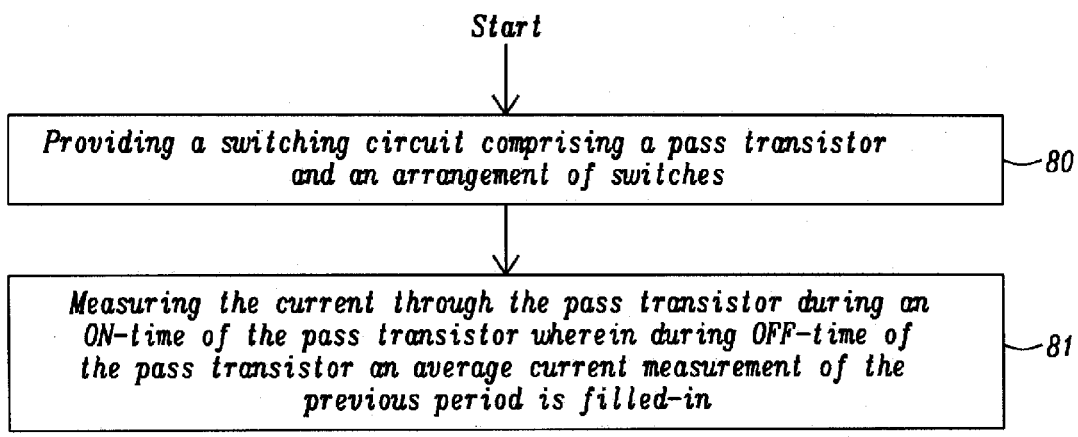
FIG. 8 shows a flowchart of a method to measure a pulsed output current of a pass transistor of a switching circuit independently of a duty cycle of the switching circuit.

FIG. 8 shows a method to measure a pulsed output current of a pass transistor of a switching circuit independently of a duty cycle of the switching circuit.

A first step 80 depicts a provision of a switching circuit comprising a pass transistor and an arrangement of switches. The next step 81 shows measuring the current through the pass transistor during an ON-time of the pass transistor, wherein an average current measurement of the previous period is filled-in during OFF-time of the pass transistor.

While the invention has been particularly shown and described with reference to the preferred embodiments thereof, it will be understood by those skilled in the art that various changes in form and details may be made without departing from the spirit and scope of the invention.

What is claimed is:

1. A circuit configured to measure a pulsed current through a pass transistor of a switching circuit in order to detect, independently of frequency and percentage of a duty cycle driving the switching circuit, if the current through the pass transistor has reached a threshold value, comprising:
   the pass transistor connected between a supply voltage and a load;
   a node for a reference voltage; and
   a circuit capable of comparing the reference voltage with a first voltage representing the pulsed current through the pass transistor during a first phase of the duty cycle of the switching circuit driving the switching circuit, while the pass transistor is ON, and of substituting the first voltage by the reference voltage during the remaining part of the duty cycle driving the switching circuit while the pass transistor is OFF, wherein the comparison detects independently of frequency and percentage of the duty cycle if an average current through the pass transistor has reached one or more threshold values over the duty cycle;
   wherein the circuit capable of comparing the reference voltage with a voltage representing the pulsed current through the pass transistor further comprises:
   a sense transistor connected between a supply voltage and a current source wherein the node for the reference voltage is deployed between the sense transistor and the current source and wherein the node for the reference voltage is connected to a second terminal of a second switch and to a second input of a comparator, wherein the sense transistor is matched to the pass transistor;

said current source connected between ground and said sense transistor;

a first switch, wherein a first terminal of the switch is connected to the load of the pass transistor and a second terminal of the switch is connected to a first input of the comparator and to a first terminal of the second switch;

said second switch; and said comparator wherein its output is used to detect if the current through the pass transistor has reached a threshold;

wherein the first switch is closed and the second switch is open during ON-time of the pass transistor and vice versa the first switch is open and the second switch is closed during OFF-time of the pass transistor.

2. The circuit of claim 1, wherein a resistive-capacitive filter is deployed at the first input of the comparator in order to smooth the input of the comparator.

3. The circuit of claim 1, wherein the switching circuit is further comprising a second pass transistor, wherein the second pass transistor is connected in series to a first pass device.

4. The circuit of claim 1, wherein the switching circuit is a DC-to-DC converter and the load is a coil.

5. The circuit of claim 4, wherein the DC-to-DC converter is a buck converter.

6. The circuit of claim 4, wherein one threshold is used to control either pulse-frequency modulation mode or pulse-width modulation mode of the DC-to-DC converter.

7. The circuit of claim 1, wherein the sense transistor is replaced by a resistor.

8. A circuit configured to measure a pulsed current through a PMOS pass transistor of a switching circuit in order to detect, independently of frequency and percentage of a duty cycle of the switching circuit, if the current through the PMOS pass transistor has reached a threshold value, comprising:

the PMOS pass transistor connected between a supply voltage and a load of the PMOS pass transistor;

a PMOS sense transistor connected between the supply voltage and a first terminal of a current source, wherein a second terminal of the current source is connected to ground, wherein a node for a reference voltage, which represents a target value of the current through the PMOS pass transistor, is deployed between the sense transistor and the current source and wherein the node for the reference voltage is connected to a second terminal of a second switch and to a second input of a comparator, wherein the sense transistor is matched to the PMOS pass transistor and a gate of the PMOS sense transistor is connected to a gate of the PMOS pass transistor;

said current source connected between ground and said sense transistor;

said node for a reference voltage;

a first switch wherein a first terminal of the switch is connected to the load of the PMOS pass transistor and a second terminal of the switch is connected to a first input of the comparator and to a first terminal of the second switch;

said second switch; and said comparator wherein its output is used to detect if the current through the PMOS pass transistor has reached a threshold;

wherein the first switch is closed and the second switch is open during ON-time of the PMOS pass transistor and vice versa the first switch is open and the second switch is closed during OFF-time of the PMOS pass transistor, hence enabling the circuit to compare the reference voltage with a first voltage representing the pulsed current through the PMOS pass transistor during a first phase of the duty cycle of the switching circuit while the PMOS pass transistor is ON, and to substitute the first voltage by the reference voltage during the remaining part of the duty cycle of the switching circuit while the PMOS pass transistor is OFF and wherein the switching circuit is further comprising a second pass transistor, which is an NMOS device, wherein the NMOS device is connected in series to the PMOS pass device between the PMOS pass device and ground voltage.

9. The circuit of claim 8 wherein a resistive-capacitive filter is deployed at the first input of the comparator in order to smooth the input of the comparator.

10. The circuit of claim 8 wherein the switching circuit is a DC-to-DC converter and the load comprises a coil.

11. The circuit of claim 10 wherein the DC-to-DC converter is a buck converter.

12. The circuit of claim 10, wherein one threshold is used to control either pulse-frequency modulation mode or pulse-width modulation mode of the DC-to-DC converter.

13. The circuit of claim 8, wherein the sense transistor is replaced by a resistor.

14. A method to measure a pulsed current through a pass transistor of a switching circuit in order to detect, independently of frequency and percentage of a duty cycle driving the switching circuit, if the current through the pass transistor has reached one or more threshold values, the method comprising the steps of:

(1) providing a switching circuit comprising the pass transistor, a reference voltage and an arrangement of two switches, wherein a sense transistor, which is matched to the pass transistor and wherein a gate of the sense transistor is connected to a gate of the pass transistor, is connected in series with a current source between the ground voltage and supply voltage, wherein a node for the reference voltage is deployed between the sense transistor and the current source, wherein the reference voltage is generated by a voltage drop of a sense transistor caused by a reference current generated by a current source wherein a gate of the sense transistor is connected to a gate of the pass transistor and wherein the reference current is defined by Iref=Ion×Ron/Rref, wherein Ion is the current through the pass transistor during ON-time, Ron is an ON-resistance of the pass transistor, and Rref is the ON-resistance of the sense transistor, (2) comparing the reference voltage with a first voltage representing the pulsed current through the pass transistor during a first phase of the duty cycle of the switching circuit while the pass transistor is ON, and substituting the first voltage by the reference voltage during the remaining part of the duty cycle of the switching circuit while the pass transistor is OFF, wherein the comparison detects independently of frequency and percentage of the duty cycle if the current through the pass transistor has reached one or more threshold values.

15. The method of claim 14, wherein the switching circuit is a switching DC-to-DC converter.

16. The method of claim 14, wherein said pass transistor is a PMOS device.

17. The method of claim 16, wherein the switching circuit is further comprising a second pass transistor, which is an NMOS device.

18. The method of claim 15, wherein the DC-to-DC converter is a buck converter.

19. The method of claim 18, wherein a threshold value controls if the buck converter operates in pulse-frequency modulation mode or in pulse-width modulation mode.

20. The method of claim 19, wherein a first input of a comparator is connected to a node between the pass transistor and a first terminal of a coil of the buck converter during ON-time of the pass transistor and the first input of the comparator is connected to the reference voltage during OFF-time of the pass transistor wherein a second input of the comparator is constantly connected to the reference voltage.

21. The method of claim 20, wherein the first input of the comparator is filtered by a RC-filter.

22. A circuit configured to measure a pulsed current through a PMOS pass transistor of a switching circuit in order to detect, independently of frequency and percentage of a duty cycle of the switching circuit, if the current through the PMOS pass transistor has reached a threshold value, wherein either pulse-frequency modulation (PFM) mode, pulse-width modulation (PWM) mode, or sleep operation mode of the circuit is supported, comprising:

the PMOS pass transistor connected between a supply voltage and a load of the PMOS pass transistor;

a NMOS pass transistor connected between ground voltage and the load of the PMOS pass transistor;

a sense transistor connected between the supply voltage and a current source wherein a node for a reference voltage is deployed between the sense transistor and the current source and wherein the node for the reference voltage is connected to a second terminal of a second switch and to a second input of a comparator, wherein the sense transistor is matched to the PMOS pass transistor;

said current source connected between ground and said sense transistor;

a first switch wherein a first terminal of the switch is connected to the load of the PMOS pass transistor and a second terminal of the switch is connected to a first input of the comparator, to a first terminal of a third switch and to a first terminal of the second switch;

said second switch;

said third switch wherein a second terminal of the third switch is connected to supply voltage of the circuit; and said comparator wherein its output is used to detect if the current through the PMOS pass transistor has reached a threshold;

where in PFM or in PWM mode the first switch is closed and the second switch is open during ON-time of the PMOS pass transistor and vice versa the first switch is open and the second switch is closed during OFF-time of the NMOS pass transistor and in sleep mode, when both PMOS pass transistor and NMOS pass transistor are OFF, the third switch is ON in order to connect the first input of the comparator, hence enabling the circuit to compare the reference voltage with a first voltage representing the pulsed current through the PMOS pass transistor during a first phase of the duty cycle of the switching circuit while the PMOS pass transistor is ON, to substitute the first voltage by the reference voltage during the remaining part of the duty cycle of the switching circuit while the PMOS pass transistor is OFF and to substitute the first voltage by the supply voltage if both pass transistors are OFF.

23. The circuit of claim 22, wherein the sense transistor is replaced by a resistor.

24. The circuit of claim 22 wherein a resistive-capacitive filter is deployed at the first input of the comparator in order to smooth the input of the comparator.

25. The method of claim 14, wherein said pass transistor is an NMOS device.

26. The method of claim 25, wherein the switching circuit is further comprising a second pass transistor, which is a PMOS device.

* * * * *